United States Patent
Veldhoven

(10) Patent No.: US 11,101,810 B1
(45) Date of Patent: Aug. 24, 2021

(54) TRAINING A MACHINE LEARNING SYSTEM FOR ADC COMPENSATION

(71) Applicant: NXP B.V., San Jose, CA (US)

(72) Inventor: Robert van Veldhoven, Valkenswaard (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/933,617

(22) Filed: Jul. 20, 2020

(51) Int. Cl.
*H03M 1/06* (2006.01)
*H03M 1/10* (2006.01)
*G06N 3/08* (2006.01)

(52) U.S. Cl.
CPC ............ *H03M 1/0626* (2013.01); *G06N 3/08* (2013.01); *H03M 1/1009* (2013.01)

(58) Field of Classification Search
CPC .... H03M 1/0626; H03M 1/1009; H03M 1/12; H03M 1/06; H03M 1/1023; G06N 3/08
USPC ................................................. 341/118, 155
See application file for complete search history.

(56) References Cited

U.S. PATENT DOCUMENTS

| | | | | |
|---|---|---|---|---|
| 6,177,893 B1 * | 1/2001 | Velazquez | ............ | H03M 1/121 341/118 |
| 6,339,390 B1 * | 1/2002 | Velazquez | ............ | H03M 1/121 341/120 |
| 6,388,594 B1 * | 5/2002 | Velazquez | ............ | H03M 1/121 341/120 |
| 6,453,309 B1 | 9/2002 | Kananen et al. | | |
| 6,473,013 B1 * | 10/2002 | Velazquez | ........... | H03M 1/1215 341/118 |
| 6,690,311 B2 * | 2/2004 | Lundin | ............... | H03M 1/1038 341/120 |
| 7,324,036 B2 * | 1/2008 | Petre | ..................... | H03M 1/121 341/110 |
| 7,843,859 B1 * | 11/2010 | Gregorian | ................ | H04B 3/23 370/290 |
| 8,009,072 B2 * | 8/2011 | Rigby | ................... | H03M 1/188 341/143 |
| 9,564,876 B2 * | 2/2017 | Kim | ................... | H03H 17/0261 |
| 10,803,258 B2 * | 10/2020 | Kenney | ................... | G06J 1/005 |
| 2006/0176197 A1 * | 8/2006 | McNeill | ............. | H03M 1/1004 341/120 |
| 2012/0013494 A1 * | 1/2012 | Song | ................... | H03M 1/0641 341/122 |
| 2013/0120062 A1 * | 5/2013 | Lozhkin | .................... | H03F 3/24 330/149 |

OTHER PUBLICATIONS

A. Bernieri et al., "ADC Neural Modeling," IEEE Transactions on Instrumentation and Measurement, vol. 45, No. 2, Apr. 1996, pp. 627-633.

(Continued)

*Primary Examiner* — Jean B Jeanglaude

(57) ABSTRACT

Analog to digital conversion errors caused by non-linearities or other sources of distortion in an analog-to-digital converter are compensated for by use of a machine learning system, such as a neural network. The machine learning system is trained based on simulation or measurement data, which utilizes a filtered output of the analog-to-digital converter that has less distortion errors than the unfiltered output of the analog-to-digital converter. The effect on the analog to digital conversion errors by Process-Voltage-Temperature parameters may be incorporated into the training of the machine learning system.

20 Claims, 6 Drawing Sheets

(56) References Cited

OTHER PUBLICATIONS

A. Bernieri et al., "ADC Neural Modeling," IEEE Instrumentation and Measurement Technology Conference pp. 789-794, 1995.

A. Baccigalupi et al., "Error Compensation of A/D Converters Using Neural Networks", IEEE Transactions on Instrumentation and Measurement, vol. 45, No. 2, Apr. 1996, pp. 640-644.

S. Xu et al., "Analog-to-digital Conversion Revolutionized by Deep Learning," arXiv: Signal Processing, Oct. 2018, 18 pages.

A. Tankimanova et al., "Level-Shifted Neural Encoded Analog-to-Digital Converter," 2017 24th IEEE International Conference on Electronics, Circuits and Systems (ICECS), Dec. 5-8, 2017, pp. 377-380.

Process-Voltage-Temperature (PVT) Variations and Static Timing Analysis, Downloaded Jul. 1, 2020 from http://asic-soc.blogspot.in/2008/03/process-variations-and-static-timing.html, 8 pages.

H. Chanal, "Hardware Implementation of an ADC Error Compensation Using Neural Networks," 2011 International Workshop on ADC Modelling, Testing and Data Converter Analysis and Design and IEEE 2011 ADC Forum, Jun. 30-Jul. 1, 2011, pp. 173-178.

U.S. Appl. No. 16/933,568, filed Jul. 20, 2020 with a title of "ADC Compensation Using Machine Learning System".

Baccigalupi, A., "Error Compensation of A/D Converters Using Neural Networks", IEEE Transactions on Instrumentation and Measurement, vol. 45, No. 2, Apr. 1996.

Baird, R.T., "Linearity Enhancement of Multi-bit ΔΣ A/D and D/A Converters Using Data Weighted Averaging", IEEE Transactions on Circuits and Systems II, vol. 42, pp. 753-762, Jul. 1995.

Bernieri, A., "ADC Neural Modeling", IEEE Transactions on Instrumentation and Measurement, pp. 789-794, Apr. 1995.

Bernieri, A., "ADC Neural Modeling", IEEE Transactions on Instrumentation and Measurement, vol. 45, No. 2, April 1996.

Black, W.C., "Time-interleaved converter arrays", IEEE J. Solid-State Circuits, vol. 15, pp. 1022-1029, Dec. 1980.

Bouhedda, M., "FPGA Implementation of Neural Nonlinear ADC-based Temperature Measurement System", IEEE International Workshop on Intelligent Data Acquisition and Advanced Computing Systems: Technology and Applications, pp. 232-237, Sep. 6-8, 2007.

Carley, L.R., "A noise-shaping coder topology for 15+ bit converters," IEEE J Solid-State Circuits, vol. 24, pp. 267-273, Apr. 1989.

Centurelli, F., "A model for the distortion due to switch on-resistance in sample-and-hold circuits", IEEE International Symposium on Circuits and Systems, May 21-24, 2006.

Chen, D.K., "Approaches to Realize High Precision Analog-to-Digital Converter Based on Wavelet Neural Network", Proceedings of the 2007 International Conference on Wavelet Analysis and Pattern Recognition, Beijing, China, Nov. 2-4, 2007.

Dyer, K.C., "Calibration and Dynamic Matching in Data Converters, Part 1: Linearity calibration and dynamic-matching techniques," Solid State Circuits Magazine, pp. 46-55, Jun. 22, 2018.

Dyer, K.C., "Calibration and Dynamic Matching in Data Converters, Part 2: Time-interleaved analog-to-digital converters and background-calibration challenges," Solid State Circuits Magazine, pp. 61-70, Jun. 22, 2018.

El-Masry, T., "High Precision ClockLess ADC Using Wavelet Neural Network", 2016 28th International Conference on Microelectronics, pp. 365-368, Dec. 17-20, 2016.

Enz, C.C., "Circuit Techniques for Reducing the Effects of Op-Amp Imperfections: Autozeroing, Correlated Double Sampling and Chopper Stabilization," IEEE J. Solid-State Circuits, vol. 84, Issue 11, pp. 1584-1614, Nov. 1996.

Fraz, H., "Characterization of Dynamic Nonlinearity in ADCs using Wavelet Networks," IEEE 10th Annual Wireless and Microwave Technology Conference, Apr. 20-21, 2009.

Fu, C., "Adaptive Neural Network Filter in Compensation of Time Interleaved AD Converter System," International Conference on Services Systems, vol. 2, pp. 1027-1030, Aug. 29, 2005.

Gao, X.Z., "AID Converter Resolution Enhancement Using Neural Networks", IEEE Instrumentation and Measurement Technology Conference, May 19-21, 1997.

Huiqing, P., "Nonuniform mismatches compensation algorithm for time-interleaved sampling system using neural networks", The Tenth International Conference on Electronic Measurement & Instruments, Aug. 16-19, 2011.

Haykin, S., Neural Networks: A Comprehensive Foundation (2nd Edition). ISBN-13: 978-0132733502, ISBN-10: 0132733501, Prentice Hall,1998.

Haykin, S., Neural Networks and learning machines (3rd Edition). ISBN-13: 978-0131471399, ISBN-10: 0131471392, Prentice Hall, Copyright 1999.

Jiang, H. "Chopping in Continuous-Time Sigma-Delta Modulators", 2017 IEEE International Symposium on Circuits and Systems, Sep. 28, 2017.

Keshavarzi, A., "Technology scaling behavior of optimum reverse body bias for standby leakage power reduction in CMOS IC's," International Symposium on Low Power Electronics and Design, pp. 252-254, Aug. 17, 1999.

Kingma, J., "Adam: A Method for Stochastic Optimization", International Conference on Learning Representations, Dec. 2014.

Leung, B.H., "Multi-bit ΣΔ A/D Converter Incorporating a Novel Class of Dynamic Element Matching Techniques," IEEE Transactions on Circuits and Systems II, vol. 39, pp. 35-51, Jan. 1992.

McNeil, J.A. ""Split-ADC" Digital Background Correction of Open-Loop Residue Amplifier Nonlinearity Errors in a 14b Pipeline ADC", IEEE International Symposium on Circuits and Systems, pp. 1237-1240, May 27-30, 2007.

Murmann, B., "On the Use of Redundancy in Successive Approximation A/D Converters", Proceedings of International Conference on Sampling Theory and Applications, pp. 556-559, 2013.

Qiu, Y., "A Novel Calibration Method of Gain and Time-skew Mismatches for Time-interleaved ADCs Based on Neural Network", IEEE MTT-S International Wireless Symposium, May 19-22, 2019.

Razavi, B. "Problem of Timing Mismatch in Interleaved ADCs", Proceedings of the IEEE 2012 Custom Integrated Circuits Conference, Sep. 9-12, 2012.

Shu, Y., "An Oversampling SAR ADC with DAC Mismatch Error Shaping Achieving 105dB SFDR and 101dB SNDR over 1 kHz BW in 55nm CMOS", ISSCC 2016 / Session 27 / Hybrid and Nyquist Data Converters / 27.2, pp. 459-459, Sep. 13, 2016.

Tsividis, Y. "Event-Driven Data Acquisition and Digital Signal Processing—A Tutorial", IEEE Transactions on Circuits and Systems—II: Express Briefs, vol. 57, No. 8, Aug. 2010.

Van Der Zwan, E.J., "A 0.2mW CMOS ΣΔ Modulator for Speech Coding with 80dB Dynamic Range," IEEE J. Solid-State Circuits, vol. 31, pp. 1873-1880, Dec. 1996.

Van Veldhoven, R., "Robust Sigma Delta Converters and their application in low-power highly-digitized flexible receivers", ISBN: 978-94-007-0643-9, Springer, 2011.

Veitch, D., "Wavelet Neural Networks and their application in the study of dynamical systems", msc thesis, University of New York, Department of Mathematics, Aug. 2005.

Werbos, P., "Beyond Regression: New Tools for Prediction and Analysis in the Behavorial Sciences", Phd Thesis, Harvard University, Jan. 1974.

Wilamowski, J., "Levenberg—Marquardt Training", Industrial Electronics Handbook—Intelligent Systems (vol. 5, 2nd Edition). ISBN 9781439802847, CRC Press, 2011.

Xu, H., "A/D Converter Background Calibration Algorithm Based on Neural Network", 2018 International Conference on Electronics Technology, pp. 1-4, May 23-27, 2018.

Yu, W., "Distortion Analysis of MOS Track-and-Hold Sampling Mixers Using Time-Varying Volterra Series", IEEE Transactions on Circuits and Systems—II: Analog and Digital Signal Processing, vol. 46, No. 2, Feb. 1999.

Zhang, T., "Use Multilayer Perceptron in Calibrating Multistage Non-linearity of Split Pipelined-ADC", International Symposium on Circuits and Systems, May 27-30, 2018.

(56) References Cited

OTHER PUBLICATIONS

Zhang, T., "Machine Learning Based Prior-Knowledge-Free Calibration for Split Pipelined-SAR ADCs with OpenLoop Amplifiers Achieving 93.7-dB SFDR", 45th European Solid-State Circuits Conference, Sep. 23-26, 2019.

* cited by examiner

TRAINING A MACHINE LEARNING SYSTEM FOR ADC COMPENSATION

CROSS-REFERENCE TO RELATED APPLICATION

This application is related to co-pending U.S. patent application Ser. No. 16/933,568, entitled "ADC COMPENSATION USING MACHINE LEARNING SYSTEM," which is hereby incorporated by reference herein.

TECHNICAL FIELD

The present disclosure relates in general to analog-to-digital converters, and in particular, to training a machine learning system to compensate for errors during processing of signals by an analog-to-digital converter.

BACKGROUND

In electronics, an analog-to-digital converter ("ADC") is a system that converts an analog signal, such as a sound picked up by a microphone or light entering a digital camera, into a digital signal. An ADC may also provide an isolated measurement such as an electronic device that converts an input analog voltage or current to a digital number representing the magnitude of the voltage or current.

There are several ADC architectures. Due to the complexity and the need for precisely matched components, all but the most specialized ADCs are implemented within integrated circuitry. These may take the form of mixed-signal integrated circuits ("ICs") that integrate both analog and digital circuits.

More specifically, an ADC converts a continuous-time and continuous-amplitude analog signal to a discrete-time and discrete-amplitude digital signal. The conversion involves quantization of the input, so it necessarily introduces a small amount of error or noise. Furthermore, instead of continuously performing the conversion, an ADC does the conversion periodically, sampling the input, thus limiting the allowable bandwidth of the input signal.

The performance of an ADC is primarily characterized by its bandwidth and signal-to-noise and distortion ratio ("SNDR"). The bandwidth of an ADC is characterized primarily by its sampling rate. The SNDR of an ADC is influenced by many factors, including the resolution, linearity and accuracy (how well the quantization levels match the true analog signal), aliasing, and jitter.

During the design, layout, and manufacturing of ICs, many errors are introduced in an ADC design. For example, errors can be introduced during the design phase due to the non-linearity of the circuit components. ADCs may suffer from nonlinearity errors caused by their physical imperfections, resulting in their output deviating from a linear function (or some other function, in the case of a deliberately nonlinear ADC) of their input. These errors can sometimes be mitigated by calibration, or prevented by testing. Important parameters for linearity are integral nonlinearity and differential nonlinearity. These nonlinearities introduce distortion that can reduce the SNDR ratio performance of the ADC and thus reduce its effective resolution.

Errors can be introduced during the layout phase as a result of unwanted parasitics that cause an imbalance in the layout of a capacitive DAC (e.g., as utilized in a sigma delta ADC or a successive approximation register ("SAR") ADC), and therefore causes a non-linearity in its transfer function.

During the manufacturing phase, errors can be introduced by mismatches in components, which can lead to additional non-linearities and offset and gain errors.

To correct for such errors, a typical approach is to increase the layout area and power of the circuits in the ADC, and expend considerable hours optimizing circuit designs and layouts, which is a very tedious and time-consuming process.

Another approach for correcting for ADC errors is by calibration. Unfortunately, a calibration approach for each different type of error is often required, which is accompanied with significant mathematical analysis and modelling, while also incurring an increase in hardware, and therefore area and increased cost. Also, if different calibration methods are combined, convergence issues of the different calibration loops might occur, leading to even more complexity.

In the measurement instrument and sensor markets, a crucial role is played by ADCs, which today represent a core of most digital equipment. Consequently, the operation of the ADC strongly affects the overall performance of the measurement or sensor apparatus in terms of metrological accuracy. In order to increase the performance of such instruments, it may be important either to design new ADCs with improved linearity and accuracy or to develop suitable techniques for compensating for ADC errors.

DETAILED DESCRIPTION

Figure 1:
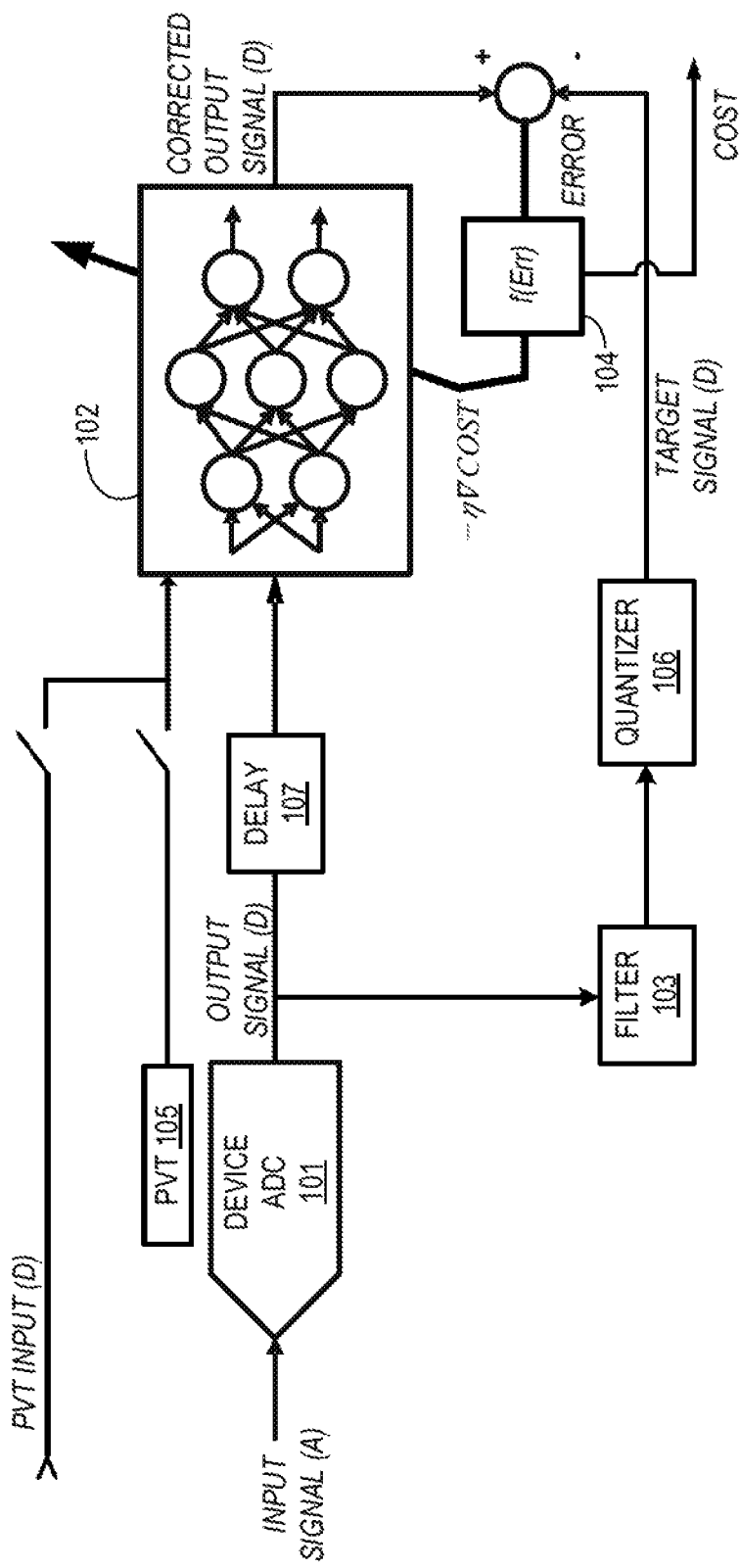
FIG. 1 illustrates a schematic block diagram of training of a machine learning system to compensate for ADC errors in accordance with certain embodiments of the present disclosure.

Embodiments of the present disclosure provide for a machine learning system to compensate for ADC errors. Essentially, the machine learning system is trained to store the "anti-errors," ideally leading to a corrected ADC. Embodiments of the present disclosure significantly reduce hardware complexity by avoiding the requirements for mathematical analysis of each and every error in the ADC, the need for an accurate error model to enable calibration (an error model would be required for each parameter to be calibrated, which would complicate calibration), and the need to implement circuitry in the ADC that would be used to calibrate for the analog circuit errors. Moreover, adding circuit elements in the analog circuitry to calibrate them often comes at the cost of obtaining an increase in achievable ADC performance, as additional parasitics will be introduced. In contrast, embodiments of the present disclosure do not require such additional analog circuits to be added to the ADC for calibration, and therefore, an increase in achievable ADC performance is not compromised, but is instead increased. For example, increased area for the additional circuits is not needed to improve matching, and current does not have to be increased to improve linearity. Additionally, if multiple parameters need to be calibrated, traditional calibration approaches might require a substantial increase in additional analog circuits to enable such calibration; whereas, embodiments of the present disclosure do not require additional analog circuits for calibration. Instead, merely some digital hardware and a representative data set are added.

Various disclosed embodiments of the present disclosure further include advantages such as a direct feed of data from the ADC without a need for any storage in between the ADC and the machine learning system, reduction of input word width from the ADC to the machine learning system without performance loss, and inclusion of desired process information to enable the machine learning system to compensate for variations in such parameters (e.g., temperature/voltage drifts and process shifts). The ADC may be designed such that it will have sufficiently low circuit noise, without optimizing for non-linearities or other errors, and instead utilize a machine learning system to compensate for all such errors.

Such a machine learning system may implement one or more any well-known machine learning algorithms, including one that implements a neural network (e.g., artificial neural network, deep neural network, convolutional neural network, recurrent neural network, autoencoders, reinforcement learning, etc.), fuzzy logic, artificial intelligence ("AI"), deep learning algorithms, deep structured learning hierarchical learning algorithms, support vector machine ("SVM") (e.g., linear SVM, nonlinear SVM, SVM regression, etc.), decision tree learning (e.g., classification and regression tree ("CART"), ensemble methods (e.g., ensemble learning, Random Forests, Bagging and Pasting, Patches and Subspaces, Boosting, Stacking, etc.), dimensionality reduction (e.g., Projection, Manifold Learning, Principal Components Analysis, etc.) and/or deep machine learning algorithms, such as those described in and publicly available at the deeplearning.net website (including all software, publications, and hyperlinks to available software referenced within this website), which is hereby incorporated by reference herein. Non-limiting examples of publicly available machine learning algorithms, software, and libraries that could be utilized within embodiments of the present disclosure include Python, OpenCV, Inception, Theano, Torch, PyTorch, Pylearn2, Numpy, Blocks, TensorFlow, MXNet, Caffe, Lasagne, Keras, Chainer, Matlab Deep Learning, CNTK, MatConvNet (a MATLAB toolbox implementing convolutional neural networks for computer vision applications), DeepLearnToolbox (a Matlab toolbox for Deep Learning (from Rasmus Berg Palm)), BigDL, Cuda-Convnet (a fast C++/CUDA implementation of convolutional (or more generally, feed-forward) neural networks), Deep Belief Networks, RNNLM, RNNLIB-RNNLIB, matrbm, deeplearning4j, Eblearn.lsh, deepmat, MShadow, Matplotlib, SciPy, CXXNET, Nengo-Nengo, Eblearn, cudamat, Gnumpy, 3-way factored RBM and mcRBM, mPoT, ConvNet, Elektronn, OpenNN, NeuralDesigner, Theano Generalized Hebbian Learning, Apache Singa, Lightnet, and SimpleDNN.

The various embodiments disclosed herein are described with respect to utilization of an artificial neural network (also simply referred to herein as a "neural network"). However, a person of ordinary skill in the art is capable of implementing any appropriate machine learning system such as previously disclosed for compensating for ADC errors in accordance with embodiments of the present disclosure.

A neural network is typically based on a collection of connected units or nodes referred to as artificial neurons, which loosely model the neurons in a biological brain. Each connection, like the synapses in a biological brain, can transmit a signal to other neurons. An artificial neuron that receives a signal then processes it and can signal neurons connected to it. In neural network implementations, the "signal" at a connection is a real number, and the output of each neuron is computed by some non-linear function of the sum of its inputs (e.g., sigmoid activation). The connections are referred to as edges. Neurons and edges typically have a weight that adjusts as training of the neural network proceeds. The weight increases or decreases the strength of the signal at a connection. Neurons may have a threshold such that a signal is sent only if the aggregate signal crosses that threshold. Typically, neurons are aggregated into layers. Different layers may perform different transformations on their inputs. Signals travel from the first layer (the input layer), to the last layer (the output layer), possibly after traversing the layers multiple times. A neural network architecture may be configured as a feed-forward network with one or more hidden layers, and with a backpropagation learning algorithm. Implementation of a neural network may involve three phases: a training, or learning, phase; a validation phase; and an inference, or production, phase. In the training phase, the neural network essentially learns by comparing its actual output with correct outputs (or at least outputs that are more near a desired output) to find errors. It then modifies the model accordingly. In the validation phase, the trained neural network is verified by means of data ("validation set"), which may be different from the data used in the training phase. In the inference, or production, phase, the trained and validated neural network is now configured and capable of providing outputs that correspond to any input.

A result of the foregoing is ADC circuitry that implements an ADC in combination with a neural network that has been trained to "know" what the analog-to-digital conversion errors are, and also to "know" how to compensate for the errors. As referred to herein, analog-to-digital conversion errors may be any type of distortion caused by circuitry within the ADC that results in the digital output signal not being a true or "ideal" digital conversion of the input analog signal. Such analog-to-digital conversion errors may be caused by non-linearities within the ADC circuitry, or any other defects or processing parameters that can produce such ADC errors, which may take the form of noise, distortion, harmonics, etc. The ADC may be any type of ADC implemented within any type of device or circuitry that utilizes an ADC. The neural networks described herein may be implemented with any type of hardware and/or software (as will be further disclosed herein), such as within an appropriate set of digital circuitry suitable for implementation of a neural network. The illustration of the neural networks within the figures is not to be limiting upon the scope of embodiments of the present disclosure. Within the various figures, "(A)" represents that the signal is an analog signal, and "(D)" represents that the signal is a digital signal.

FIG. 1 illustrates an exemplary schematic diagram of a training phase in which a filtered output from a device ADC 101 (labeled as the Target Signal) is used to train a neural network 102 for compensation of the Output Signal of the device ADC 101. The filtered output is produced by passing the Output Signal from the ADC 101 through a digital filter 103 that is used to substantially filter out the harmonics and excessive noise produced by the ADC 101 during conversion of the analog Input Signal, which in a sense reconstructs the Input Signal. Essentially, the output of the filter 103 sufficiently represents an "ideal" digital signal that normally would be produced by a reference ADC that produces fewer conversion errors than the device ADC 101. In accordance with embodiments of the present disclosure, the filter 103 may be configured to produce a sinewave at the output of the filter 103 that sufficiently represents an output of a reference ADC that produces a desired amount of fewer conversion errors than the device ADC 101. This can be done by designing the parameters of the filter 103 so that it filters out an amount of distortion (e.g., harmonics and excessive noise) that the neural network 102 is to be trained to compensate for.

The filter 103 may be a finite impulse response ("FIR") filter or an infinite impulse response ("IIR") filter. The filter 103 may be a low-pass, band-pass, or high-pass filter, depending on the Input Signal used during the training phase. The gain of the filter may be selected at the training frequency (or frequencies). In the case of a sine wave input, the filter 103 may be configured to pass the fundamental harmonic of the Input Signal, and block all higher order harmonics. The function of the filter 103 could be changed depending on the frequency of the Input Signal and harmonics. For example, if the frequency of the Input Signal is reasonably high, a bandpass filter could be used to remove the low and high frequency noise and the signal harmonics. The filter 103 may be a programmable filter that would be configured to allow for a frequency dependent training of the neural network 102.

To compensate for a propagation delay through the filter 103, a delay circuit or element 107 may be introduced between the ADC 101 and the neural network 102, which may be configured with a fixed delay or a frequency dependent delay, depending on what is needed. In accordance with certain embodiments of the present disclosure, an optional quantizer 106 may be introduced after the filter 103 to reduce the amount of output bits, as the filter 103 might be long depending on pass-band/stop-band requirements, leading to large word widths, and therefore result in additional hardware implemented within the neural network 102. Quantization, in digital signal processing, is a process of mapping input values from a large set to output values in a (countable) smaller set, often with a finite number of elements. The quantizer 106 may be any device that is configured to perform a desired quantization (e.g., truncating, rounding, scaling, a highest number of bits, a lowest number of bits, etc.). In accordance with alternative embodiments of the present disclosure, one or more quantizers may be used throughout the system to limit word widths and thus possibly save hardware.

In accordance with certain embodiments of the present disclosure, utilizing an analog Input Signal, the neural network 102 is trained by an Error signal, which is a difference between the Corrected Output Signal from the neural network 102 and the Target Signal. To accomplish this, the Target Signal is subtracted from the Corrected Output Signal of the neural network 102. The Error signal produced is passed through a cost function 104 used to train the neural network 102 (e.g., using a Levenberg-Marquardt algorithm, backpropagation (gradient descent) algorithm, or similar algorithms). Backpropagation computes the gradient in weight space of a feedforward neural network, with respect to a loss function. Using backpropagation, computational parameters (e.g., weights and/or biases) of the neural network 102 are adapted (e.g., following a steepest descent method, also known as gradient descent). However, any suitable cost function and training algorithm may be utilized for training the neural network. The training phase may be continuously, or repeatedly, performed until the Corrected Output Signal of the neural network 102 has minimum errors (or at least a desired set of fewer errors) as compared to the Target Signal after completion of the training phase. One manner by which the Error can be measured is with a Fast Fourier Transform to check distortion in the spectrum of the Corrected Output Signal. Alternatively, the Cost output may be used to determine when the Error is reduced to an acceptable level using any appropriate methodology.

Training of the neural network 102 can be performed under different scenarios. For example, in accordance with embodiments of the present disclosure, the training phase can be performed for each individual ADC 101 (e.g., for each IC containing an ADC 101, or even separately for each ADC 101 of multiple ADCs implemented on a single IC). This approach yields a neural network 102 specifically trained for each ADC 101. Note that because of variations in the manufacturing of each individual ADC, training of the neural network 102 for one particular ADC may not work equally well for another ADC, and therefore, in such instances, the other ADC may have to be (at least partially) re-trained.

In accordance with embodiments of the present disclosure, the training phase can be performed on a batch of multiple ADCs (e.g., on multiple ICs each containing an ADC 101). In this way, the trained neural network 102 generalizes errors into one model, i.e., the neural network knowledge base after training. This knowledge base is now representative of all errors present in the batch of multiple ADCs. Therefore, such a knowledge base can represent, and compensate for, errors that generalize well across multiple ADCs.

In accordance with certain embodiments of the present disclosure, one or more PVT parameters 105 may be optionally incorporated so that the neural network 102 can further compensate the output of the ADC 101, since such PVT parameters can affect or cause errors in the functioning of the ADC 101.

As is well-known in the art, PVT is an acronym for Process-Voltage-Temperature. Process variation accounts for deviations in the semiconductor fabrication process. Process variations may be due to variations in the manufacturing conditions such as temperature, pressure and dopant concentrations. Various voltages (e.g., supply voltage, reference voltage, bias condition on a device) utilized within an IC can vary from the established designed value during day-to-day operation and also over its life-time, which can affect the operation of circuit components in an ADC. And, when an IC is operating, the temperature can vary throughout the IC, which can thus affect the operational parameters of various circuit components.

For example, analog circuits, such as implemented for incorporation of ADCs, are known to be voltage and/or temperature dependent. Consequently, voltage-temperature ("VT") corner information can be provided to the neural network 102 as an input to enable the neural network 102 to correct for voltage and/or temperature drifts that can cause errors in the operation of the ADC 101 so that the neural network 102 can further compensate for such voltage and/or temperature drifts. Moreover, temperature and voltage information are often typically readily available on integrated circuits. For example, an integrated circuit on which the ADC 101 is implemented may include temperature and/or voltage sensors whose outputs can be input into the neural network 102 along with the output of the ADC 101. As a result, as the neural network 102 is trained, the cost function 104 will take into account the effects on the errors caused by such processing inputs to be utilized for adjusting the weights and/or biases within the nodes of the neural network 102.

Note that in accordance with embodiments of the present disclosure, any type of process related information could be added as a PVT Input to the neural network 102, such as various technology parameters (e.g., electron mobility, transistor parameters (e.g., Vt, fT, Beta, doping), resistor parameters (e.g., nominal resistor value, voltage dependency), or capacitor parameters (e.g., nominal capacitor value, voltage dependency). As long as there is a manner in which to measure a process related parameter, then the output of this measurement can be provided as a PVT Input to the neural network 102. Moreover, even if a particular parameter cannot be measured on the integrated circuit, they could be obtained from wafer measurements, and then such PVT parameters may be stored in a memory device (not shown) on the integrated circuit or supplied from an external source (e.g., an external memory device or a microprocessor or microcontroller) as the digital PVT Input into the neural network 102. Furthermore, the neural network 102 may be trained based on all available PVT parameters or any particular desired set of one or more PVT parameters for a particular single ADC or a batch of ADCs.

Figure 2:
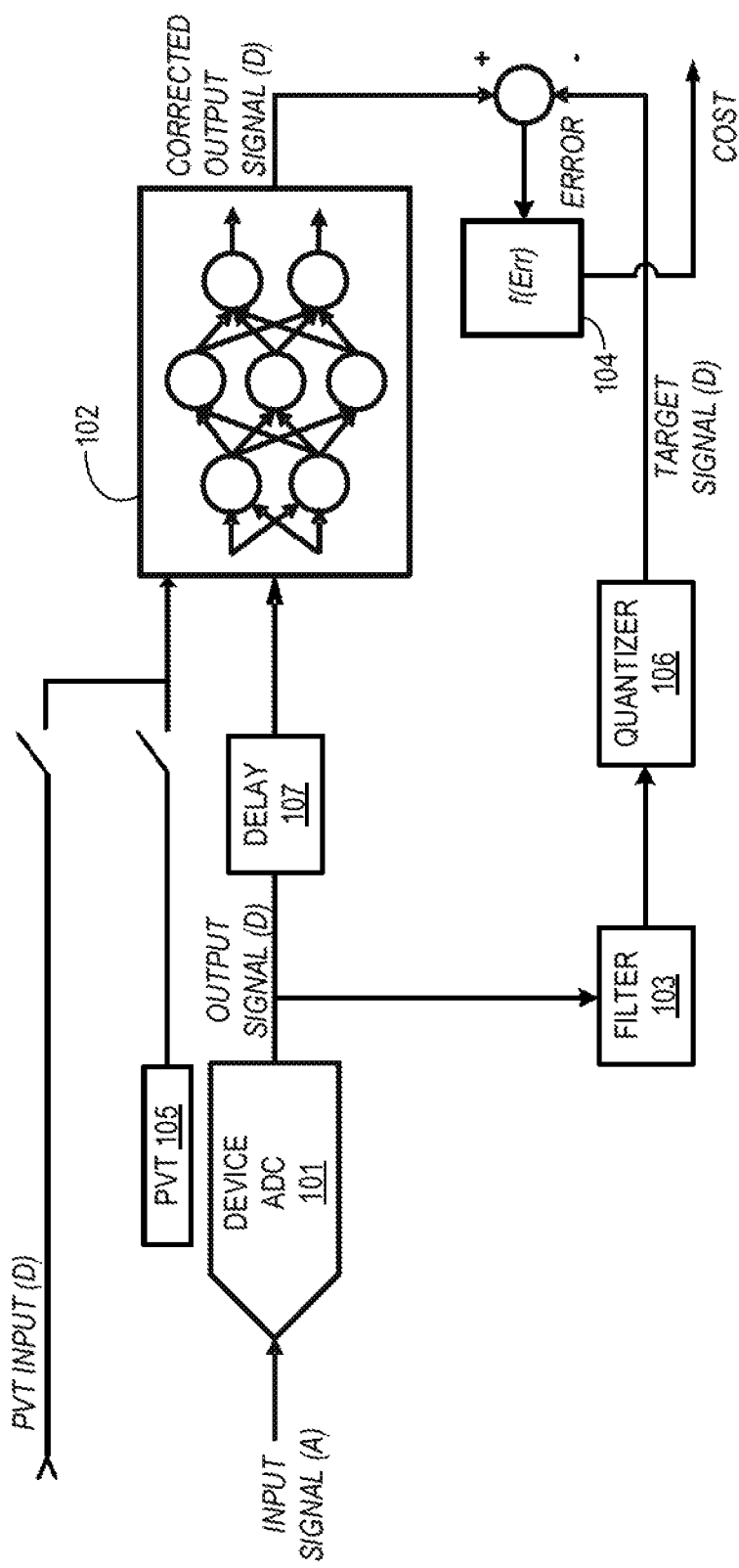
FIG. 2 illustrates a schematic block diagram of validation of a machine learning system to compensate for ADC errors in accordance with certain embodiments of the present disclosure.

FIG. 2 illustrates an exemplary schematic diagram of a validation phase that may be performed whereby an analog Input Signal is input to the ADC 101 to check if the Error is now significantly small or at least minimized or reduced for a set of exemplary inputs that the ADC 101 may encounter. Measurement of the Error may be performed in a manner as similarly described with respect to FIG. 1, or by any other appropriate technique well-known in the art. Such a validation phase may be utilized when training has been performed on one or more batches of ADCs to determine if another batch of ADCs would also be satisfactorily compensated by the trained neural network 102. As described with respect to FIG. 1, if the neural network 102 was trained with one or more PVT parameters, these may be utilized within the validation phase.

Figure 3:
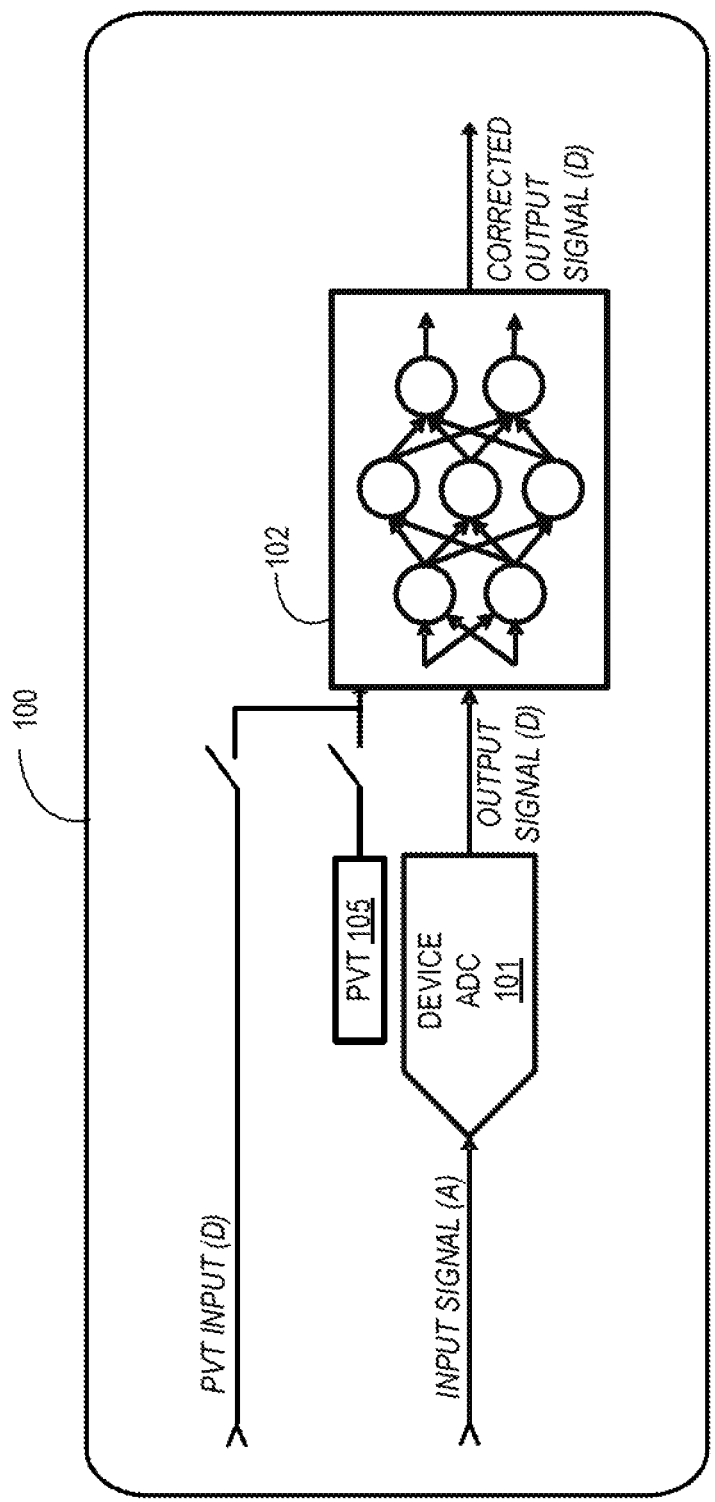
FIG. 3 illustrates a schematic block diagram of an inference phase of a machine learning system configured to compensate for ADC errors in accordance with certain embodiments of the present disclosure.

In accordance with certain embodiments of the present disclosure, for instance where training of ADCs 101 is performed in a single sample training process (i.e., not in batches of ADCs), the validation phase may be omitted, since the inference phase described with respect to FIG. 3 may be sufficient.

FIG. 3 illustrates the inference, or production, phase whereby the ADC circuitry, i.e., the ADC 101 and neural network 102, are implemented (e.g., on an integrated circuit 100) for operation within a final end-use application (e.g., the end-use application of the integrated circuit 100). Other circuitry within the integrated circuit 100 is not shown for the sake of clarity. It is during this inference phase that an analog Input Signal is applied to the ADC 101, which produces a digital Output Signal that is then modified by the trained neural network 102 to produce a compensated or calibrated Corrected Output Signal, which may be utilized by other circuitry within the IC 100. Note that in accordance with certain embodiments of the present disclosure, the inference phase may also be utilized for the final production testing of the trained neural network 102. For example, the output from the neural network 102 may be checked by comparing it to parameters specified for this designed ADC 101. And, as described with respect to FIG. 1, the neural network 102 may be operated to take into account one or more PVT parameters 105 during the inference phase.

Figure 4:
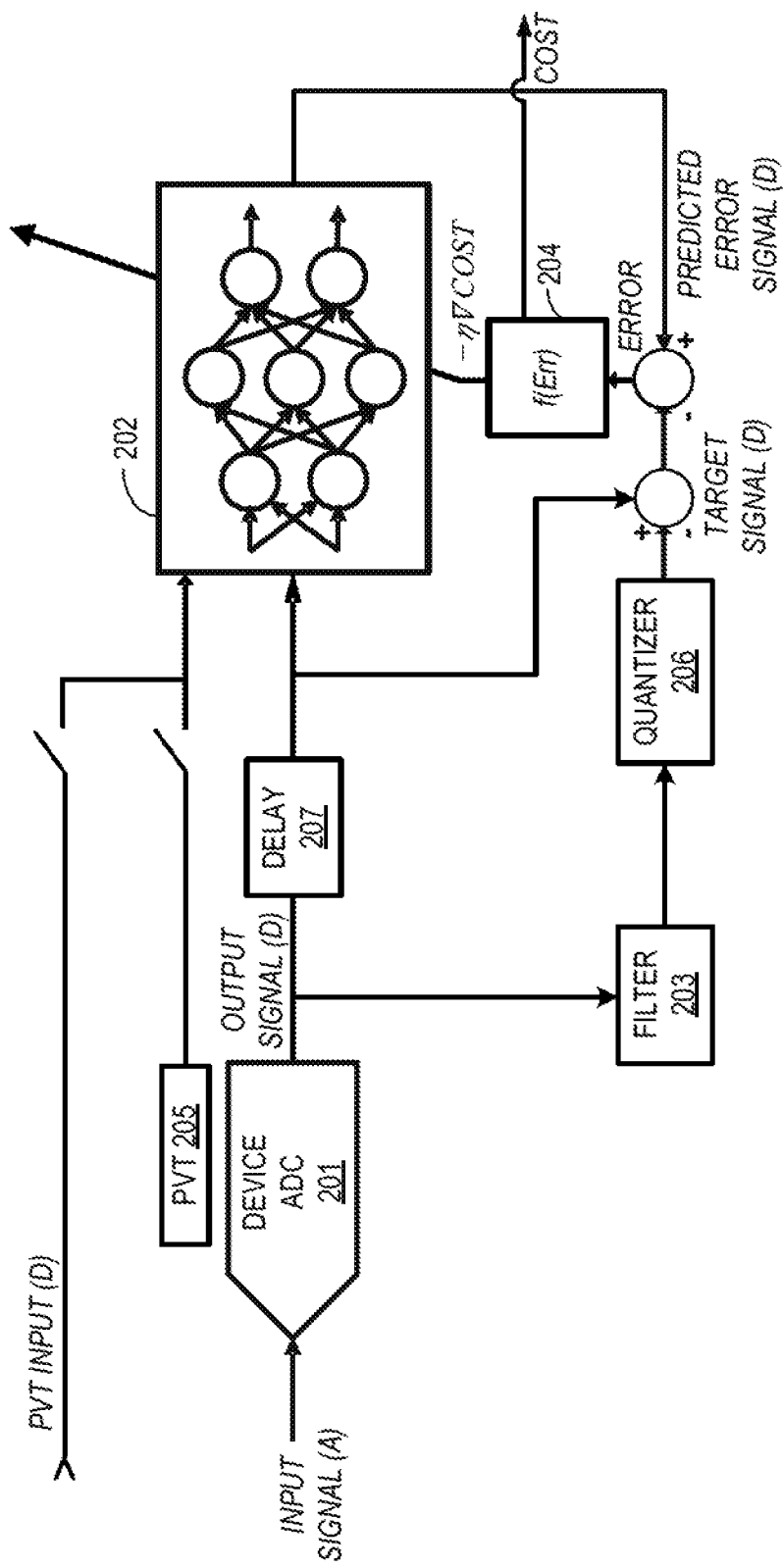
FIG. 4 illustrates a schematic block diagram of training of a machine learning system to compensate for ADC errors in accordance with certain embodiments of the present disclosure.

FIG. 4 illustrates training of a neural network 202 for compensating for errors within a device ADC 201 in accordance with certain embodiments of the present disclosure. In such embodiments, the neural network 202 is trained by the difference between the Output Signal of the ADC 201 (i.e., without compensation by the neural network 202) and the filtered output of the ADC 203. This difference, labeled as the Target Signal, is then subtracted from the Predicted Error Signal output from the neural network 202 to produce an Error signal, which is processed through a cost function 204 to train the neural network 202 (e.g., using backpropagation or similar algorithms). The filtered output is produced by passing the Output Signal from the ADC 201 through a digital filter 203, which may be configured in a similar manner as the filter 103.

To compensate for a propagation delay through the filter 203, a delay circuit or element 207 may be introduced between the ADC 201 and the neural network 202, which may be configured in a similar manner as the delay circuit or element 107. In accordance with certain embodiments of the present disclosure, an optional quantizer 206 may be introduced after the filter 203 to reduce the amount of output bits, as the filter 203 might be long depending on pass-band/stop-band requirements, leading to large word widths, and therefore result in additional hardware implemented within the neural network 202. The quantizer 206 may be configured in a similar manner as the quantizer 106.

This approach for training of the neural network 202 results in the neural network 202 only needing to provide the error, and thus does not have to provide the complete ADC dynamic range (or codes), which may result in a requirement for less hardware for implementation of the neural network 202, since less hardware is needed because the errors made by the ADC 201 usually only span the lower significant bits ("LSBs") of the ADC 201. Therefore, the output word width (and internal calculation word widths) of the neural network 202 can be smaller since it is only compensating for the distortion caused within the ADC 201. As similarly described with respect to the training phase of FIG. 1, the training phase approach of FIG. 4 can be applied to a single ADC 201 or a batch of ADCs.

In accordance with alternative embodiments of the present disclosure, the Target Signal may be provided by blocking the fundamental frequency with a band stop filter, which provides the error signal directly, instead of subtracting the filtered Output Signal from the delayed unfiltered Output Signal. Depending on the analog Input Signal, the filter that can be used can be band stop, low pass (for very high frequency input signals), or high pass (for very low frequency input signals).

Figure 5:
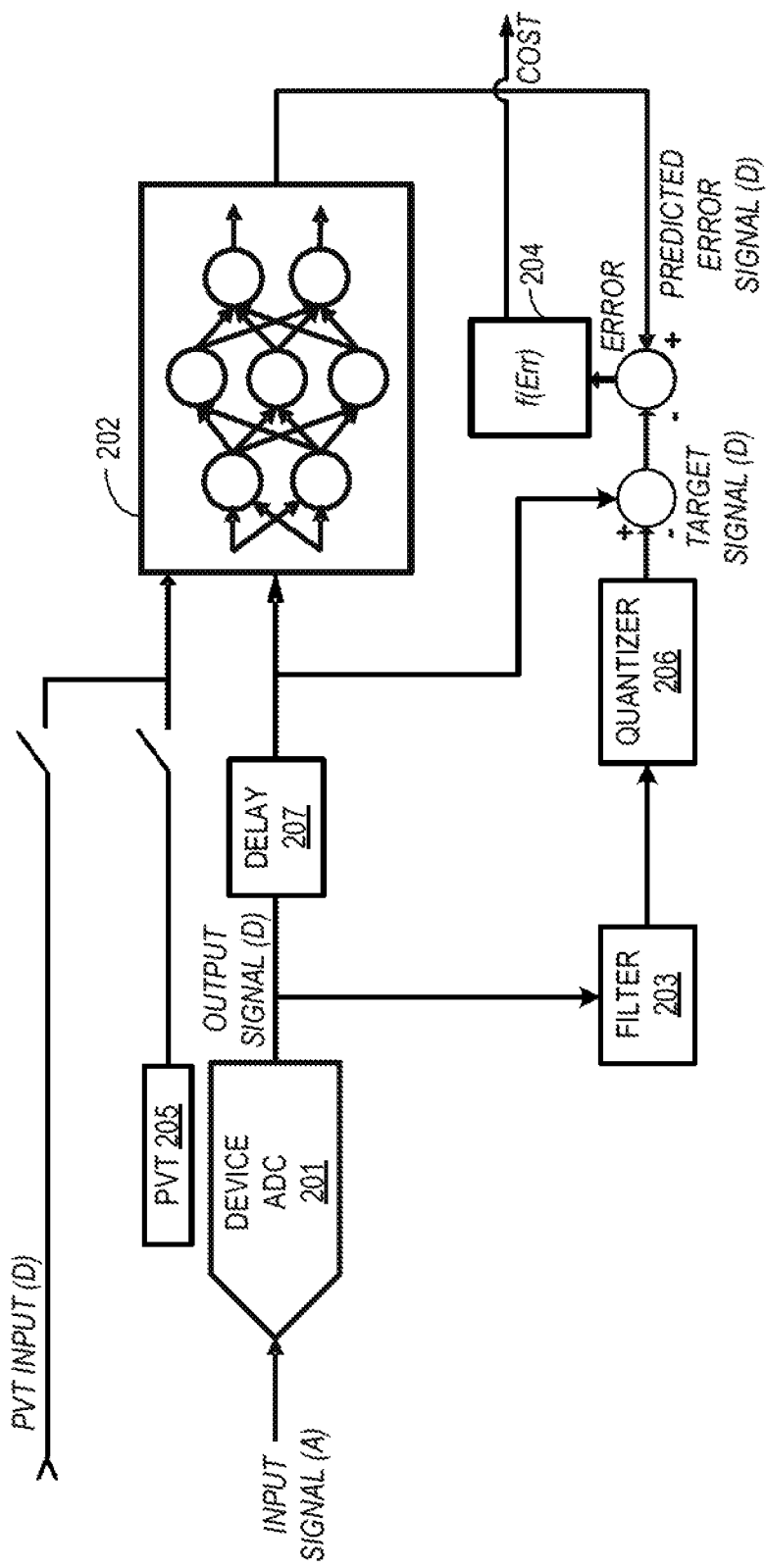
FIG. 5 illustrates a schematic block diagram of validation of a machine learning system to compensate for ADC errors in accordance with certain embodiments of the present disclosure.

FIG. 5 illustrates an exemplary schematic diagram of a validation phase that may be performed whereby an analog Input Signal is input to the ADC 201 to check if the Error is now significantly small or at least minimized or decreased for a set of exemplary inputs that the ADC 201 may encounter. The validation phase may be performed in a manner as similarly described with respect to FIG. 2. Such a validation phase may be utilized when training has been performed on one or more batches of ADCs to determine if another batch of ADCs would be also satisfactorily compensated by the trained neural network 202.

Figure 6:
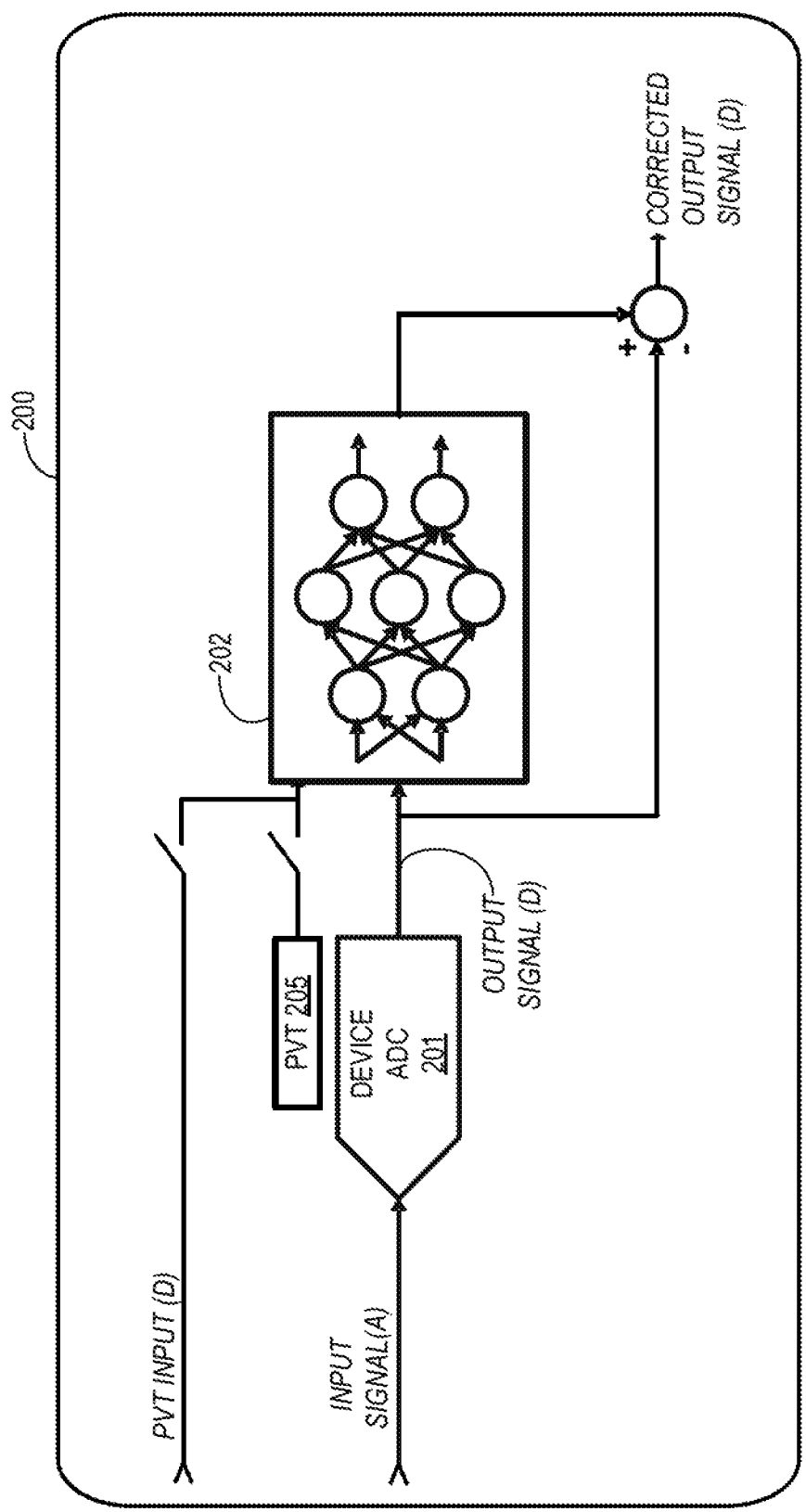
FIG. 6 illustrates a schematic block diagram of an inference phase of a machine learning system configured to compensate for ADC errors in accordance with certain embodiments of the present disclosure.

In accordance with certain embodiments of the present disclosure, for instances where training of ADCs 201 is performed in a single sample training process (i.e., not in batches of ADCs), the validation phase may be omitted, since the inference phase described with respect to FIG. 6 may be sufficient.

FIG. 6 illustrates an example of the inference phase, which may be utilized for both the final production testing of the ADC 201 and within the end-use application (e.g., of an integrated circuit 200) in which the ADC 201 is implemented. Other circuitry within the integrated circuit 200 is not shown for the sake of clarity. In accordance with these certain embodiments of the present disclosure, the Predicted Error output from the neural network 202 is subtracted from the Output Signal of the ADC 201 to provide the compensated Corrected Output Signal.

To reduce the complexity of the added neural network (i.e., hardware), the number of ADC bits fed to the neural network may be reduced, since the more bits fed into the neural network, the higher its implementation cost in hardware.

As previously described with respect to FIGS. 1-6, PVT parameters, such as VT corner information may be provided to the neural network as a PVT Input to enable the neural network to correct for voltage and temperature drifts of the errors to be compensated. To demonstrate the efficacy of providing such PVT parameters to a neural network compensating for an ADC, the polynomial distortion function was taken the same as before. Temperature and voltage dependency may be added in different ways. For example, a temperature and voltage dependent gain can be added to the polynomial:

$$y = G(T) \cdot H(V) \cdot (a_1 x + a_2 x^2 + a_3 x^3 + a_4 x^4 + a_5 x^5)$$

Alternatively, a temperature and voltage dependency can be added to the higher order terms (harmonics):

$$y = a_1 x + G(T) \cdot H(V) \cdot (a_2 x^2 + a_3 x^3 + a_4 x^4 + a_5 x^5)$$

A temperature dependency was arbitrarily chosen to introduce a linear behavior with temperature:

$$G(T) = 1 + \frac{T - 55}{950}$$

A voltage dependency was arbitrarily chosen to introduce a quadratic dependency with voltage.

$$H(V) = 0.5 V^2 + 0.495,$$

These dependencies were chosen such that they introduced an error of +/−10% in the $a_1$, $a_2$, $a_3$, $a_4$, $a_5$ coefficients over a temperature range of −40° C. to 150° C., and a voltage range of 0.9 V to 1.1 V.

Furthermore, nine VT corners were defined:

| # | Temperature [° C.] | Voltage [V] |
|---|---|---|
| 1 | 150 | 0.9 |
| 2 | 150 | 1.0 |
| 3 | 150 | 1.1 |
| 4 | 25 | 0.9 |
| 5 | 25 | 1.0 |
| 6 | 25 | 1.1 |
| 7 | −40 | 0.9 |
| 8 | −40 | 1.0 |
| 9 | −40 | 1.1 |

As expected, if the VT inputs are provided to the neural network results are much better in both cases. Without VT compensation, the SNDR improves after compensation, but does not recover to 10 bits. If the VT inputs are added to the neural network, the SNDR returns to approximately 9.5 bits (the missing 0.5 bits is due to the input signal not being full scale).

Note that in accordance with embodiments of the present disclosure, the training, validation, and/or phases described herein with respect to FIGS. 1-6 may be performed in a manner in which the various components are implemented on an IC or off of an IC, or a combination of the foregoing. For example, a test-chip of the device ADC is produced, and a pre-selected number of samples are measured. With this data, a neural network is trained in software. Next, the trained neural network (with fixed biases and weights) together with the device ADC is implemented into a product (e.g., an IC in which the ADC circuitry is implemented).

In certain embodiments of the present disclosure, training of the machine learning system may be performed using multiple input signals of different frequencies.

As has been described herein, various embodiments of the present disclosure implement a machine learning system configured to compensate for ADC errors. Such a machine learning system may be implemented within hardware and/or software, such as within one or more data processing systems. Nevertheless, the functionalities described herein are not to be limited for implementation into any particular hardware/software platform.

As will be appreciated by one skilled in the art, aspects of the present disclosure may be embodied as a system, process, method, and/or program product. Accordingly, various aspects of the present disclosure (e.g., the machine learning system) may take the form of an entirely hardware embodiment, an entirely software embodiment (including firmware, resident software, micro-code, etc.), or embodiments combining software and hardware aspects, which may generally be referred to herein as a "circuit," "circuitry," "module," or "system." Furthermore, aspects of the present disclosure may take the form of a program product embodied in one or more computer readable storage medium(s) having computer readable program code embodied thereon. (However, any combination of one or more computer readable medium(s) may be utilized. The computer readable medium may be a computer readable signal medium or a computer readable storage medium.)

A computer readable storage medium may be, for example, but not limited to, an electronic, magnetic, optical, electromagnetic, infrared, biologic, atomic, or semiconductor system, apparatus, controller, or device, or any suitable combination of the foregoing, wherein the computer readable storage medium is not a transitory signal per se. More specific examples (a non-exhaustive list) of the computer readable storage medium may include the following: an electrical connection having one or more wires, a portable computer diskette, a hard disk, a random access memory ("RAM"), a read-only memory ("ROM"), an erasable programmable read-only memory ("EPROM" or flash memory), an optical fiber, a portable compact disc read-only memory ("CD-ROM"), an optical storage device, a magnetic storage device, or any suitable combination of the foregoing. In the context of this document, a computer readable storage medium may be any tangible medium that can contain or store a program for use by or in connection with an instruction execution system, apparatus, controller, or device. Program code embodied on a computer readable signal medium may be transmitted using any appropriate medium, including but not limited to wireless, wire line, optical fiber cable, RF, etc., or any suitable combination of the foregoing.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, controller, or device.

The block diagrams in the figures illustrate architecture, functionality, and operation of possible implementations of circuitry, systems, methods, processes, and program products according to various embodiments of the present disclosure. In this regard, certain blocks in the block diagrams (e.g., neural networks 102, 202, cost functions 104, 204, filters 103, 203, quantizers 106, 206, delay circuits 107, 207) may represent a module, segment, or portion of code, which includes one or more executable program instructions for implementing the specified logical function(s). It should also be noted that, in some implementations, the functions noted in the blocks may occur out of the order noted in the figures. For example, two blocks shown in succession may, in fact, be executed substantially concurrently, or the blocks may sometimes be executed in the reverse order, depending upon the functionality involved.

Modules implemented in software for execution by various types of processors may, for instance, include one or more physical or logical blocks of computer instructions, which may, for instance, be organized as an object, procedure, or function. Nevertheless, the executables of an identified module need not be physically located together, but may include disparate instructions stored in different locations which, when joined logically together, include the module and achieve the stated purpose for the module. Indeed, a module of executable code may be a single instruction, or many instructions, and may even be distributed over several different code segments, among different programs, and across several memory devices. Similarly, operational data (e.g., knowledge bases of adapted weights and/or biases described herein) may be identified and illustrated herein within modules, and may be embodied in any suitable form and organized within any suitable type of data structure. The operational data may be collected as a single data set, or may be distributed over different locations including over different storage devices. The data may provide electronic signals on a system or network.

These program instructions may be provided to one or more processors and/or controller(s) of a general purpose computer, special purpose computer, or other programmable data processing apparatus (e.g., controller) to produce a machine, such that the instructions, which execute via the processor(s) of the computer or other programmable data processing apparatus, create circuitry or means for implementing the functions/acts specified in the block diagram block or blocks.

It will also be noted that each block of the block diagrams, and combinations of blocks in the block diagrams (e.g., neural networks 102, 202, cost functions 104, 204, filters 103, 203, quantizers 106, 206, delay circuits 107, 207), can be implemented by special purpose hardware-based systems (e.g., which may include one or more graphics processing units) that perform the specified functions or acts, or combinations of special purpose hardware and computer instructions. For example, a module (e.g., neural networks 102, 202, cost functions 104, 204, filters 103, 203, quantizers 106, 206, delay circuits 107, 207) may be implemented as a hardware circuit including custom VLSI circuits or gate arrays, off-the-shelf semiconductors such as logic chips, transistors, controllers, or other discrete components. A module (e.g., neural networks 102, 202, cost functions 104, 204, filters 103, 203, quantizers 106, 206, delay circuits 107, 207) may also be implemented in programmable hardware devices such as field programmable gate arrays, programmable array logic, programmable logic devices, application specific ICs, microcontrollers, systems on a chip, general purpose processors, microprocessors, or the like.

Computer program code, i.e., instructions, for carrying out operations for aspects of the present disclosure may be written in any combination of one or more programming languages, including an object oriented programming language such as Java, Smalltalk, Python, C++, or the like, conventional procedural programming languages, such as the "C" programming language or similar programming languages, or any of the machine learning software disclosed herein.

These program instructions may also be stored in a computer readable storage medium that can direct a computer system, other programmable data processing apparatus, controller, or other devices to function in a particular manner, such that the instructions stored in the computer readable medium produce an article of manufacture including instructions which implement the functions/acts specified in the block diagram block or blocks.

The program instructions may also be loaded onto a computer, other programmable data processing apparatus, controller, or other devices to cause a series of operational steps to be performed on the computer, other programmable apparatus or other devices to produce a computer implemented process such that the instructions which execute on the computer, other programmable apparatus, or other devices provide processes for implementing the functions/acts specified in the block diagram block or blocks.

Embodiments of the present disclosure provide an apparatus that includes an ADC configured to convert an analog input signal to a digital output signal; and a machine learning system configured to compensate for analog-to-digital conversion errors produced within circuitry of the ADC, wherein the machine learning system has been trained to compensate for the analog-to-digital conversion errors with an error signal that is a difference between an output of the neural network and a filtered output from the ADC. The filtered output from the ADC may be produced by a filter configured to reconstruct the input signal from the digital output signal. The filter may be configured to filter out one or more higher order harmonics from the digital output signal. The apparatus may further include a quantizer configured to reduce a word width of the filtered output. The apparatus may further include a delay circuit between an output of the ADC and an input of the machine learning system, wherein the delay circuit is configured to compensate for a propagation delay caused by the filter. The apparatus may further include circuitry configured to input a PVT parameter into the machine learning system, wherein an output of the ADC varies as a function of a value of the PVT parameter, wherein the machine learning system has been trained to compensate for the analog-to-digital conversion errors while factoring in an effect on the output of the ADC resulting from one or more values of the PVT parameters. The PVT perimeter may be a semiconductor manufacturing related process variation, voltage, and/or temperature. The machine learning system may be a neural network that has been previously configured during a training phase to compensate for the analog-to-digital conversion errors using a cost function that receives an error signal, wherein the error signal is a difference between an output of the neural network during the training phase and a target signal that includes a difference between an unfiltered output of the ADC and the filtered output from the ADC. The filtered output from the ADC may be produced by a filter configured to filter out all but the fundamental frequency from the digital output signal. The apparatus may further include circuitry configured to input a PVT parameter into the neural network, wherein the neural network has been trained to compensate for the analog-to-digital conversion errors while factoring in an effect on the output of the ADC resulting from one or more values of the PVT parameters.

Embodiments of the present disclosure provide a method that includes inputting an analog signal into an ADC configured to convert the analog signal into a digital output signal; and modifying the digital output signal with a machine learning system in which computational parameters of the machine learning system are configured to compensate for distortion produced by the ADC during conversion of the analog signal to the digital output signal, wherein the computational parameters were previously configured during a training phase of the machine learning system using a cost function operating on an error signal produced by a difference between an output of the machine learning system and a target signal that is produced as a function of a filtered output from the ADC. The computational parameters may include weights and biases assigned to nodes within the machine learning system. The filtered output from the ADC may be produced by a digital filter configured to filter out a predetermined amount of distortion that the machine learning system is trained to compensate for. The method may further include quantizing the filtered output to produce the target signal. The target signal may be a difference between an unfiltered output of the ADC and a signal that is a function of the filtered output. The method may further include inputting a PVT parameter into the machine learning system, wherein the computational parameters of the machine learning system have been configured during the training phase to compensate for the distortion while factoring in effects on the distortion due to the PVT parameter.

Embodiments of the present disclosure provide a method that includes inputting a first analog signal into an ADC configured to convert the first analog signal into a first digital output signal; and training a machine learning system to compensate for distortion errors produced within the first digital output signal by the ADC during conversion of the first analog signal to the first digital output signal. The method may further include, subsequent to the training of the machine learning system, inputting a second analog signal into the ADC to produce a second digital output signal; and modifying the second digital output signal with the trained machine learning system to produce a corrected output signal, wherein the corrected output signal has fewer distortion errors than the second digital output signal. The training may configure computational parameters within the machine learning system using a cost function operating on an error signal produced by a difference between an output of the machine learning system and a target signal that is produced as a function of a filtered output from the ADC, wherein the filtered output from the ADC is produced by a digital filter configured to filter out a predetermined amount of the distortion errors. The method may further include inputting a PVT parameter into the machine learning system, wherein the computational parameters of the machine learning system are further configured during the training to compensate for the distortion errors while factoring in effects on the first digital output signal due to the PVT parameter.

Reference is made herein to "configuring" a device or a device "configured to" perform some function. It should be understood that this may include selecting predefined logic blocks and logically associating them, such that they provide particular logic functions, which includes monitoring or control functions. It may also include programming computer software-based logic of a retrofit control device, wiring discrete hardware components, or a combination of any or all of the foregoing. Such configured devices are physically designed to perform the specified function. Various units, circuits, or other components (e.g., the neural networks 102, 202) may be described as "configured to" perform a task or tasks (e.g., the training, validation, and inference phases). In such contexts, "configured to" is a broad recitation of structure generally meaning "having circuitry that is capable of" performing the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke a 35 U.S.C. § 112, paragraph six interpretation for that unit/circuit/component.

In the descriptions herein, numerous specific details are provided, such as examples of cost functions, backpropagation algorithms, machine learning systems, neural networks, filters, delay elements, quantizers, programming, software modules, user selections, network transactions, database queries, database structures, hardware modules, hardware circuits, hardware chips, controllers, etc., to provide a thorough understanding of embodiments of the disclosure. One skilled in the relevant art will recognize, however, that the disclosure may be practiced without one or more of the specific details, or with other cost functions, backpropagation algorithms, machine learning systems, neural networks, artificial intelligence systems, filters, delay elements, quantizers, methods, components, materials, and so forth. In other instances, well-known structures, materials, neural networks, circuit elements, logical functions, logical subtraction elements, or operations may be not shown or described in detail to avoid obscuring aspects of the disclosure. To the extent not described herein, many details regarding specific materials, processing acts, circuits, and circuit elements are conventional, and may be found in textbooks and other sources within the computing, electronics, and software arts.

Reference throughout this specification to "an embodiment," "embodiments," "various embodiments," "certain embodiments," or similar language means that a particular feature, structure, or characteristic described in connection with the embodiments is included in at least one embodiment of the present disclosure. Thus, appearances of the phrases "in one embodiment," "in an embodiment," "embodiments," "certain embodiments," "various embodiments," and similar language throughout this specification may, but do not necessarily, all refer to the same embodiment. Furthermore, the described features, structures, aspects, and/or characteristics of the disclosure may be combined in any suitable manner in one or more embodiments. Correspondingly, even if features may be initially claimed as acting in certain combinations, one or more features from a claimed combination can in some cases be excised from the combination, and the claimed combination can be directed to a sub-combination or variation of a sub-combination.

Benefits, advantages, and solutions to problems have been described above with regard to specific embodiments. However, the benefits, advantages, solutions to problems, and any element(s) that may cause any benefit, advantage, or solution to occur or become more pronounced may be not to be construed as critical, required, or essential features or elements of any or all the claims. Further, no component described herein is required for the practice of the disclosure unless expressly described as essential or critical.

A number of embodiments of the disclosure have been described. Nevertheless, it will be understood that various modifications may be made without departing from the spirit and scope of the present disclosure. Accordingly, other embodiments are within the scope of the following claims.

It will be appreciated that any components said to be coupled may be coupled or connected either directly or indirectly. In the case of indirect coupling, additional components may be located between the two components that are said to be coupled.

The singular forms "a," "an," and "the" include plural referents unless the context clearly dictates otherwise. As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

What is claimed is:

1. An apparatus comprising:
    an analog-to-digital converter ("ADC") configured to convert an analog input signal to a digital output signal; and
    a machine learning system configured to compensate for analog-to-digital conversion errors produced within circuitry of the ADC, wherein the machine learning system has been trained to compensate for the analog-to-digital conversion errors with an error signal that is a difference between an output of the machine learning system and a filtered output from the ADC.

2. The apparatus as recited in claim 1, wherein the filtered output from the ADC is produced by a filter configured to reconstruct the input signal from the digital output signal.

3. The apparatus as recited in claim 2, wherein the filter is configured to filter out one or more higher order harmonics from the digital output signal.

4. The apparatus as recited in claim 2, further comprising a quantizer configured to reduce a word width of the filtered output.

5. The apparatus as recited in claim 2, further comprising a delay circuit between an output of the ADC and an input of the machine learning system, wherein the delay circuit is configured to compensate for a propagation delay caused by the filter.

6. The apparatus as recited in claim 1, further comprising circuitry configured to input a Process-Voltage-Temperature ("PVT") parameter into the machine learning system, wherein an output of the ADC varies as a function of a value of the PVT parameter, wherein the machine learning system has been trained to compensate for the analog-to-digital conversion errors while factoring in an effect on the output of the ADC resulting from one or more values of the PVT parameters, wherein the PVT parameter is selected from a group consisting of a semiconductor manufacturing related process variation, voltage, and temperature.

7. The apparatus as recited in claim 1, wherein the training of the machine learning system results in the machine learning system being configured to compensate for the analog-to-digital conversion errors with an error signal that is a difference between an output of the machine learning system and a filtered output from the ADC.

8. The apparatus as recited in claim 1, wherein the machine learning system is a neural network that has been previously configured during a training phase to compensate for the analog-to-digital conversion errors using a cost function that receives the error signal, wherein the error signal is a difference between an output of the neural network during the training phase and a target signal that comprises a difference between an unfiltered output of the ADC and the filtered output from the ADC.

9. The apparatus as recited in claim 8, wherein the filtered output from the ADC is produced by a filter configured to filter out all but the fundamental frequency from the digital output signal.

10. The apparatus as recited in claim 9, further comprising circuitry configured to input a Process-Voltage-Temperature ("PVT") parameter into the neural network, wherein the neural network has been trained to compensate for the analog-to-digital conversion errors while factoring in an effect on the output of the ADC resulting from one or more values of the PVT parameters.

11. A method comprising:
    inputting an analog signal into an analog-to-digital converter ("ADC") configured to convert the analog signal into a digital output signal; and
    modifying the digital output signal with a machine learning system in which computational parameters of the machine learning system are configured to compensate for distortion produced by the ADC during conversion of the analog signal to the digital output signal, wherein the computational parameters were previously configured during a training phase of the machine learning system using a cost function operating on an error signal produced by a difference between an output of the machine learning system and a target signal that is produced as a function of a filtered output from the ADC.

12. The method as recited in claim 11, wherein the computational parameters comprise weights and biases assigned to nodes within the machine learning system.

13. The method as recited in claim 11, wherein the filtered output from the ADC is produced by a digital filter configured to filter out a predetermined amount of distortion that the machine learning system is trained to compensate for.

14. The method as recited in claim 13, further comprising quantizing the filtered output to produce the target signal.

15. The method as recited in claim 13, wherein the target signal is a difference between an unfiltered output of the ADC and a signal that is a function of the filtered output.

16. The method as recited in claim 13, further comprising inputting a PVT parameter into the machine learning system, wherein the computational parameters of the machine learning system have been configured during the training phase to compensate for the distortion while factoring in effects on the distortion due to the PVT parameter.

17. A method comprising:
   inputting a first analog signal into an analog-to-digital converter ("ADC") configured to convert the first analog signal into a first digital output signal; and
   training a machine learning system to compensate for distortion errors produced within the first digital output signal by the ADC during conversion of the first analog signal to the first digital output signal.

18. The method as recited in claim 17, further comprising:
   subsequent to the training of the machine learning system, inputting a second analog signal into the ADC to produce a second digital output signal; and
   modifying the second digital output signal with the trained machine learning system to produce a corrected output signal, wherein the corrected output signal has fewer distortion errors than the second digital output signal.

19. The method as recited in claim 17, wherein the training configures computational parameters within the machine learning system using a cost function operating on an error signal produced by a difference between an output of the machine learning system and a target signal that is produced as a function of a filtered output from the ADC, wherein the filtered output from the ADC is produced by a digital filter configured to filter out a predetermined amount of the distortion errors.

20. The method as recited in claim 19, further comprising inputting a PVT parameter into the machine learning system, wherein the computational parameters of the machine learning system are further configured during the training to compensate for the distortion errors while factoring in effects on the first digital output signal due to the PVT parameter.

* * * * *